United States Patent
Ha

(10) Patent No.: US 11,152,452 B2
(45) Date of Patent: Oct. 19, 2021

(54) ORGANIC LIGHTING APPARATUS

(71) Applicant: LG DISPLAY CO., LTD., Seoul (KR)

(72) Inventor: Hyunggun Ha, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 70 days.

(21) Appl. No.: 16/721,590

(22) Filed: Dec. 19, 2019

(65) Prior Publication Data

US 2020/0212165 A1 Jul. 2, 2020

(30) Foreign Application Priority Data

Dec. 31, 2018 (KR) .................. 10-2018-0173489

(51) Int. Cl.
*H01L 27/32* (2006.01)

(52) U.S. Cl.
CPC .. *H01L 27/3288* (2013.01); *H01L 2251/5392* (2013.01)

(58) Field of Classification Search
CPC .............. H01L 27/3288; H01L 27/329; H01L 51/5209; H01L 2251/5361; H01L 2251/5392
See application file for complete search history.

(56) References Cited

U.S. PATENT DOCUMENTS 9,167,657 B2  10/2015 Yim et al.
2017/0346035 A1* 11/2017 Lee .................. H01L 51/5234

FOREIGN PATENT DOCUMENTS

| CN | 106098739 A | 11/2016 |
|---|---|---|
| EP | 3144995 A1 | 3/2017 |
| EP | 3236507 A1 | 10/2017 |
| EP | 3333925 A1 | 6/2018 |
| KR | 10-2006-0001503 A | 1/2006 |
| KR | 10-2012-0129296 A | 11/2012 |

* cited by examiner

*Primary Examiner* — Daniel P Shook
(74) *Attorney, Agent, or Firm* — Birch, Stewart, Kolasch & Birch, LLP

(57) ABSTRACT

An organic lighting apparatus can include a substrate; and a plurality of light-emitting portions disposed in a central area of the substrate, each of the plurality of light-emitting portions has a structure including: a first electrode, an organic light-emitting layer, a second electrode, a non-light-emitting area, a light-emitting area, and an electric current injection line disposed in the non-light emitting area, in which the electric current injection lines of at least two light-emitting portions have different lengths.

16 Claims, 9 Drawing Sheets

ORGANIC LIGHTING APPARATUS

CROSS-REFERENCE TO RELATED APPLICATION

This application claims priority to and the benefit of Korean Patent Application No. 10-2018-0173489, filed in the Republic of Korea on Dec. 31, 2018, the disclosure of which is incorporated herein by reference in its entirety.

FIELD

The present disclosure relates to an organic lighting apparatus and, more specifically, to an organic lighting apparatus that can enhance luminance uniformity.

BACKGROUND

Currently, fluorescent lamps or incandescent lamps are used as a lighting apparatus. However, fluorescent lamps have a low color rendering index (CRI) and contain mercury that is one of the causes of environmental pollution while incandescent lamps have low energy efficiency.

Recently, LED lights using a nitride semiconductor-based light-emitting diode have been presented. However, LED lights require a means to dissipate a large amount of heat generated from light-emitting diodes at the rear surfaces thereof.

Light-emitting diodes are manufactured through the processing of epitaxial vapor deposition on a rigid substrate such as a sapphire substrate. Accordingly, light-emitting diodes are not very flexible unless an individual light-emitting diode chip is mounted onto a flexible substrate.

Research into an organic lighting apparatus using organic light-emitting diodes has been underway to overcome the limitations of conventional nitride semiconductor-based LED lights. A large-scale fabrication of an organic light-emitting diode can be easily achieved, and organic light-emitting diodes can be formed on an inexpensive glass substrate or an inexpensive plastic substrate. When organic light-emitting diodes are formed on a plastic substrate, a flexible organic lighting apparatus can be manufactured.

Luminance in an area near an electrode is higher than luminance in an area far away from the electrode. Accordingly, studies of technologies for enhancing luminance uniformity of organic lighting apparatuses have been performed.

SUMMARY

An aspect of the present disclosure provides an organic lighting apparatus that can enhance luminance uniformity.

Another aspect of the present disclosure provides an organic lighting apparatus that has a structure for reducing or preventing a short circuit.

The objectives of the present disclosure should not be limited to what has been mentioned. Additionally, the other objectives and advantages that have not been mentioned may be understood from the following description and implementations. Further, it will be apparent that the objectives and advantages of the present disclosure may be implemented through means and a combination thereof in the appended claims.

According to the subject matter described in this specification, an organic lighting apparatus includes a substrate and a plurality of light-emitting portions arranged in the central area of the substrate. The plurality of light-emitting portions have a structure in which a first electrode, an organic light-emitting layer and a second electrode are stacked. Additionally, the plurality of light-emitting portions respectively include a light-emitting area and a non-light-emitting area outside the light-emitting area. A first electrode of each of the plurality of light-emitting portions includes an electric current injection line in the non-light-emitting area. The electric current injection lines of at least two of the plurality of light-emitting portions have different lengths.

When the electric current injection lines included in the plurality of light-emitting portions have the same length, the light-emitting portions are highly likely to have different luminance. In an example, a light-emitting portion near a pad portion has excessively high luminance while a light-emitting portion far away from the pad portion has excessively low luminance, thereby causing a decrease in uniformity of luminance. In another example, when a routing portion is arranged on both edges of the pad portion to distribute electric current, a light-emitting portion near the routing portion has excessively high luminance while the central part of the substrate far away from the routing portion has excessively low luminance.

In embodiments of the present disclosure, as a result of a different length of the electric current injection line included in each of the light-emitting portions, uniformity of luminance can improve. The electric current injection lines act as resistance and raise a barrier to entry of electric current into each light-emitting portion. In the situation of a light-emitting portion having excessively high luminance, when the electric current injection line is lengthened, a resistance value can increase, and luminance can decrease. Conversely, in the situation of a light-emitting portion having excessively low luminance, when the electric current injection line is shortened, a resistance value can decrease, and luminance can increase. By doing so, uniformity of luminance improves as a whole.

An insulator line can be arranged on both sides of an electric current injection line.

An integrally structured gate line can be arranged in the non-light-emitting area, contacting the first electrode. In this situation, the non-light-emitting area can have a structure where a gate line, a first electrode and an insulation layer are stacked.

A pad portion can be arranged on one edge of the substrate. As another example, a first pad portion is arranged on one edge of the substrate, and a second pad portion can be arranged on the other edge of the substrate. Preferably, an electric current injection line becomes shorter when the electric current injection line is farther away from the pad portion.

To this end, according to embodiments of the present disclosure, an organic lighting apparatus includes a substrate, a gate line, a first insulator line, a second insulator line, a first electrode, an insulation layer and an organic light-emitting layer. The gate line is arranged in the central area of the substrate and defines a plurality of light-emitting portions. The first insulator line is arranged in parallel with the gate line on the edges of the plurality of light-emitting portions on the substrate in which the gate line is arranged. The second insulator line is parallel with a part of the first insulator line.

The first electrode is arranged in the rest area except for the first insulator line and the second insulator line on the substrate in which the gate line is arranged. In processing, a first electrode is arranged on the front surface of the substrate in which the gate line is arranged, and then first and second insulator lines can be formed through etching. An insulation layer is arranged on the substrate on which the first electrode is arranged to cover up the gate line. The first insulator line and the second insulator line can be a part of the insulation layer. An organic light-emitting layer is arranged on the substrate on which the insulation layer is arranged. The second electrode is arranged on the organic light-emitting layer. In this situation, the second insulator lines of at least two of the plurality of light-emitting portions have different lengths.

An electric current injection line is arranged between the first insulator line and the second insulator line. The electric current injection line can be a part of the first electrode. Resistance is proportional to length of material and inversely proportional to width of material. In the situation of material having the same width, as length of the material increases, resistance increases. When an electric current injection line made of ITO is arranged between the first insulator line and the second insulator line, a resistance value of the electric current injection line increases in proportion to a length of the electric current injection line. Thus, when length of an electric current injection line is adjusted, uniformity of luminance of each light-emitting portion can be adjusted, thereby making it possible to enhance uniformity of luminance as a whole.

The gate line can be made of a metallic material, and the first electrode can be made of a transparent conductive oxide. In the situation of a first electrode being made of a transparent conductive oxide, light emits from the lower part of the substrate. The second electrode can be made of a metallic material, such as aluminum and, in this situation, can serve as a reflecting electrode. In the situation of a second electrode made of a transparent conductive oxide, light can emit from the upper and lower parts of the substrate.

A pad portion can be arranged in the outer area of the substrate. A first pad and a second pad of the pad portion can respectively include a first layer formed as the same layer as the gate line and a second layer formed as the same layer as the first electrode. When an electric current injection line is located farther away from the pad portion, the electric current injection line can be made shorter.

According to an organic lighting apparatus of an embodiment of the present disclosure, different resistances of different light-emitting portions results in an increase in uniformity of luminance.

In embodiments of the present disclosure, when the electric current injection line of each light-emitting portion has a different length, the electric current injection line of each light-emitting portion has a different resistance. In the situation of a light-emitting portion having excessively high luminance, when the electric current injection line is lengthened, a resistance value can increase, and luminance can decrease. Conversely, in the situation of a light-emitting portion having excessively low luminance, when the electric current injection line made shorter, a resistance value can be decreased, and luminance can increase. By doing so, uniformity of luminance improves as a whole.

Effects and advantages of the present disclosure will be specifically described in the detailed description of the present disclosure.

DETAILED DESCRIPTION OF THE EMBODIMENTS

Figure 1:
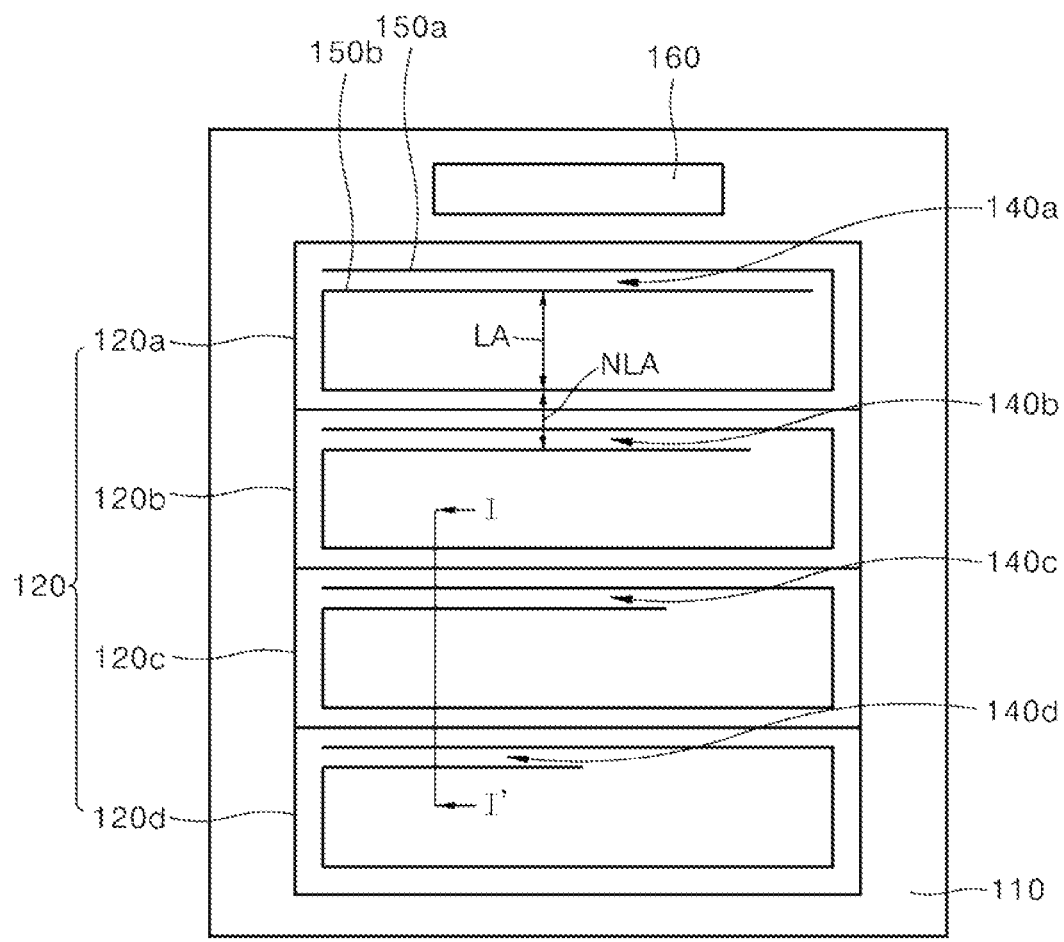
FIG. 1 is a plan view schematically illustrating an example organic lighting apparatus according to an embodiment of the present disclosure.

The above-mentioned objectives, features and advantages will be described with reference to the attached drawings such that one having ordinary skill in the art can readily implement embodiments of the present disclosure. In describing the disclosure, detailed description of the well-known technologies in relation to the disclosure will be omitted if it is deemed to make the gist of the disclosure unnecessarily vague. Implementations of the disclosure will be described with reference to the attached drawings. Like reference numerals denote like elements throughout the specification.

It should be understood that when one element is described as being arranged in the "upper part (or lower part)" of another element, or at the "top (or bottom)" of another element, one element may be directly arranged on the upper surface (or lower surface) of another element while contacting another element, and a third element may be interposed between one element arranged at the top (or bottom) of another element and another element.

It should be further understood that when one element is described as being "linked", "coupled", or "connected" to another element, one element may be directly linked or connected to another element, a third element may be "interposed" between one element and another element, or one element and another element may be "linked," "coupled" or "connected" by a third element.

An example organic lighting apparatus according to implementations will be described.

Figure 2:
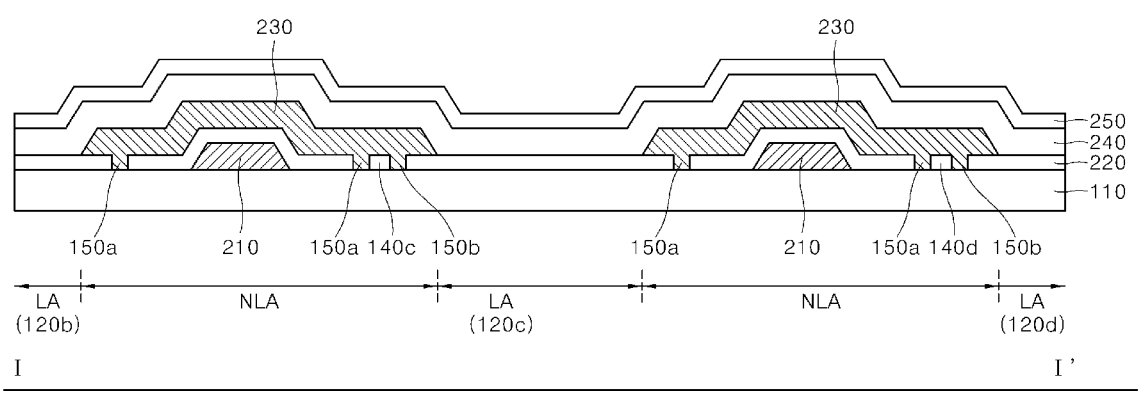
FIG. 2 is a view illustrating a cross section cut along line I-I' in FIG. 1 according to an embodiment of the present disclosure.

FIG. 1 is a plan view schematically illustrating an example organic lighting apparatus, and FIG. 2 is a view illustrating a cross section cut along line I-I' in FIG. 1.

Referring to FIGS. 1 and 2, the illustrated organic lighting apparatus includes a substrate 110 and a plurality of light-emitting portions 120 arranged on the substrate. FIG. 1 illustrates four light-emitting portions 120a, 120b, 120c and 120d. However, the number of the light-emitting portions is not restricted.

The substrate 110 can be made of glass or plastic, such as polyimide (PI), polyethylene terephthalate (PET), polypropylene (PP), polycarbonate (PC), and the like. When the substrate 110 is made of plastic, an organic light-emitting apparatus can be flexible. In the situation of a substrate 110 made of plastic, organic light-emitting apparatuses can be continuously manufactured by means of roll-to-roll processing. An internal light extraction layer as in a structure of a microlens can be further arranged onto the substrate 110 to improve luminous efficiency. A light extraction film can be further attached to the lower part of the substrate 110 to improve luminous efficiency. A barrier layer can be further arranged on the upper part of the substrate 110 to prevent moisture from invading from the lower part of the substrate. A single layer of $SiO_2$, SiNx, and the like can be arranged as a barrier layer, or multiple layers of $SiNx/SiO_2/SiNx$, and the like can be arranged as a barrier layer.

The plurality of light-emitting portions 120 have a structure in which a first electrode 220, an organic light-emitting layer 240 and a second electrode 250 are stacked Additionally, the plurality of light-emitting portions 120 include a light-emitting area (LA) and a non-light-emitting area (NLA) outside the light-emitting area. Referring to FIG. 2, when electric current is supplied, light emits in the light-emitting area (LA) with a structure in which a first electrode 220, an organic light-emitting layer 240 and a second electrode 250 are stacked while even when electric current is supplied, light does not emit in the non-light-emitting area (NLA) with a structure in which a first electrode 220, an insulation layer 230, an organic light-emitting layer 240 and a second electrode 250 are stacked.

The first electrode 220 can be made of a transparent conductive oxide, such as indium tin oxide (ITO), fluorine-doped tin oxide (FTO), and the like. The isolation layer 230 can be made of an organic material, such as a polyimide-based material or an inorganic material such as alumina ($Al_2O_3$) or silicon nitride (SiNx), and the like.

The organic light-emitting layer 240 includes organic light-emitting materials, such as copper phthalocyanine (CuPc), N,N'-Di(naphthalene-1-yl)-N,N'-diphenylbenzidine (NPB), tris-8-hydroxyquinoline aluminum (Alq3) or various well-known organic light-emitting materials. The organic light-emitting layer 240 can include an electron injection layer, an electron transport layer, a light-emitting layer, a hole transport layer, a hole injection layer, and the like.

In this situation, a tandem-structured light-emitting layer that includes two or more of light-emitting layers can be used as an organic light-emitting layer. A structure in which two or more light-emitting layers are directly stacked or a structure in which an intermediate layer, such as a hole transport layer or an electron transport layer, and the like is include between two or more light-emitting layers can be used for an organic light-emitting layer. For instance, tandem structures of an organic light-emitting layer includes a structure where a blue light-emitting layer, a green light-emitting layer and a red light-emitting layer are consecutively stacked, a structure where a red light-emitting layer and a red light-emitting layer are consecutively stacked, a structure where a blue light-emitting layer, a yellow/green light-emitting layer and a blue light-emitting layer are consecutively stacked, a structure where a red/green light-emitting layer, a blue light-emitting layer and a red/green light-emitting layer are consecutively stacked, and the like.

Aluminum (Al), silver (Ag), and the like or a transparent conductive oxide such as ITO, and the like can be used for the second electrode 250.

For example, the first electrode 220 can be an anode while the second electrode 250 can be a cathode. Electrons are injected into the organic light-emitting layer 240 from the second electrode 250, and holes are injected into the organic light-emitting layer 240 from the first electrode 220. As the electrons and the holes are injected into the organic light-emitting layer 240, excitons are generated in the organic light-emitting layer 240, and as the excitons decay, light corresponding to a difference in energy of the lowest unoccupied molecular orbital (LUMO) and the highest occupied molecular orbital (HOMO) of the organic light-emitting layer 240 is generated.

The first electrode 220 of each of the plurality of light-emitting portions 120 has an electric current injection line 140a, 140b, 140c and 140d in the non-light-emitting area (NLA). The electric current injection lines 140a, 140b, 140c and 140d are parts with high resistance in the light-emitting portion 120. The electric current injection lines 140a, 140b, 140c and 140d raise a barrier to entry of electric current into the light-emitting area (LA) of the light-emitting portion 120 by means of high resistance. In the presence of the electric current injection lines, a short circuit of the first and second electrodes that occurs in one light-emitting portion barely affects the other light-emitting portions. If a light-emitting portion does not have an electric current injection line, none of the light-emitting portions may operate when a short circuit of the first and second electrodes occurs in one light-emitting portion. In this regard, the electric current injection lines can be referred to as a structure for reducing a short circuit.

Figure 3:
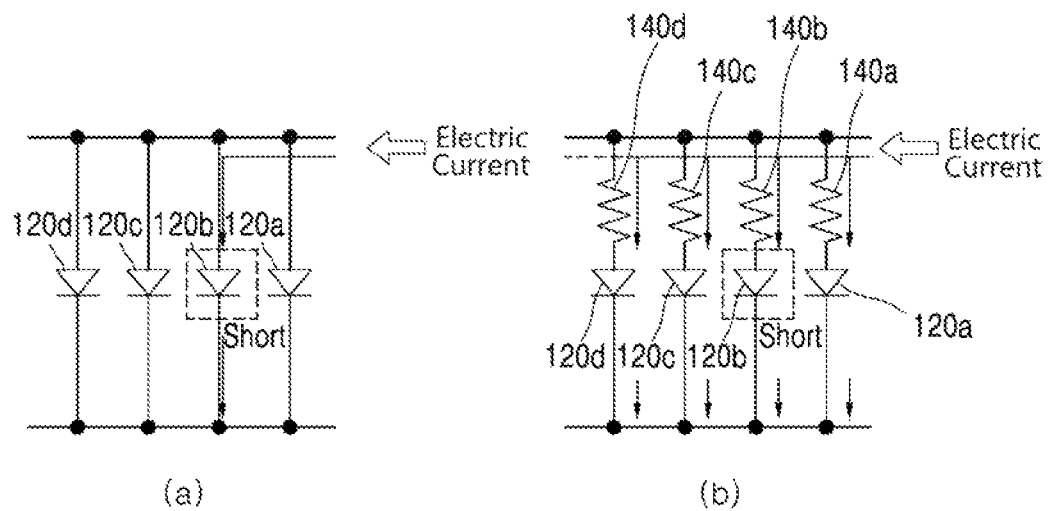
FIG. 3 includes parts (a) and (b), (a) is a view illustrating electric current when a short circuit occurs in the absence of an example electric current injection line, and (b) is a view illustrating electric current when a short circuit occurs in the presence of an example electric current injection line according to an embodiment of the present disclosure.

FIG. 3 (a) is a view illustrating electric current when a short circuit occurs in the absence of an electric current injection line for injecting electric current, and (b) is a view illustrating electric current when a short circuit occurs in the presence of an electric current injection line.

Referring to (a) of FIG. 3, in the situation of a light-emitting portion without electric current injection lines, when a short circuit of first and second electrodes occurs in a specific light-emitting portion (e.g., 120b in FIG. 3), electric current can be injected only into the short-circuited light-emitting portion 120b but not be injected into the other light-emitting portions 120a, 120c, 120d. Thus, none of the organic light-emitting apparatuses are likely to operate.

On the contrary, referring to (b) of FIG. 3, in the situation of a light-emitting portion with electric current injection lines 140a, 140b, 140c, 140d having high resistance, even when a short circuit of first and second electrodes occurs in a specific light-emitting portion (120b in FIG. 3), electric current can still be normally injected into the other light-emitting portions 120a, 120c, 20d in the presence of the electric current injection line 140b. Thus, the short-circuited light-emitting portion 120b is the only light-emitting portion that does not operate.

Loss of electric current caused by a short circuit of the first and second electrodes in a specific light-emitting portion can be expressed as follows:

Loss of electric current=driving voltage/resistance of electric current injection line.

That is, loss of electric current is inversely proportional to resistance of electric current injection line. As in embodiments of the present disclosure, resistance of electric current injection line leads to a reduction in the loss of electric current.

Referring to FIG. 1, electric current injection lines 140a, 140b, 140c and 140d of the plurality of light-emitting portions 120a, 120b, 120c and 120d have different lengths. When the light-emitting portions have the same luminance, uniformity of luminance is not an issue. However, when one of the light-emitting portions has luminance higher than that of the other light-emitting portions, uniformity of luminance is an issue.

In embodiments of the present disclosure, electric current injection lines 140a, 140b, 140c, 140d of at least two of the light-emitting portions 120a, 120b, 120c, 120d have different lengths to improve uniformity of luminance. A difference in the length of an electric current injection line results in a difference in resistance of the electric current injection line of each light-emitting portion.

When resistance of the electric current injection lines is low, luminance is relatively high while when resistance of the electric current injection lines is high, luminance is relatively low. That is, in the situation of a light-emitting portion having excessively high luminance, when the electric current injection line is lengthened, a resistance value can increase, and luminance can decrease. Conversely, in the situation of a light-emitting portion having excessively low luminance, when the electric current injection line is shortened, a resistance value can decrease, and luminance can increase. In this way, uniformity of luminance improves as a whole. Below, effects of the various lengths of electric current injection lines on resistance will be described with reference to FIG. 4.

Figure 4:
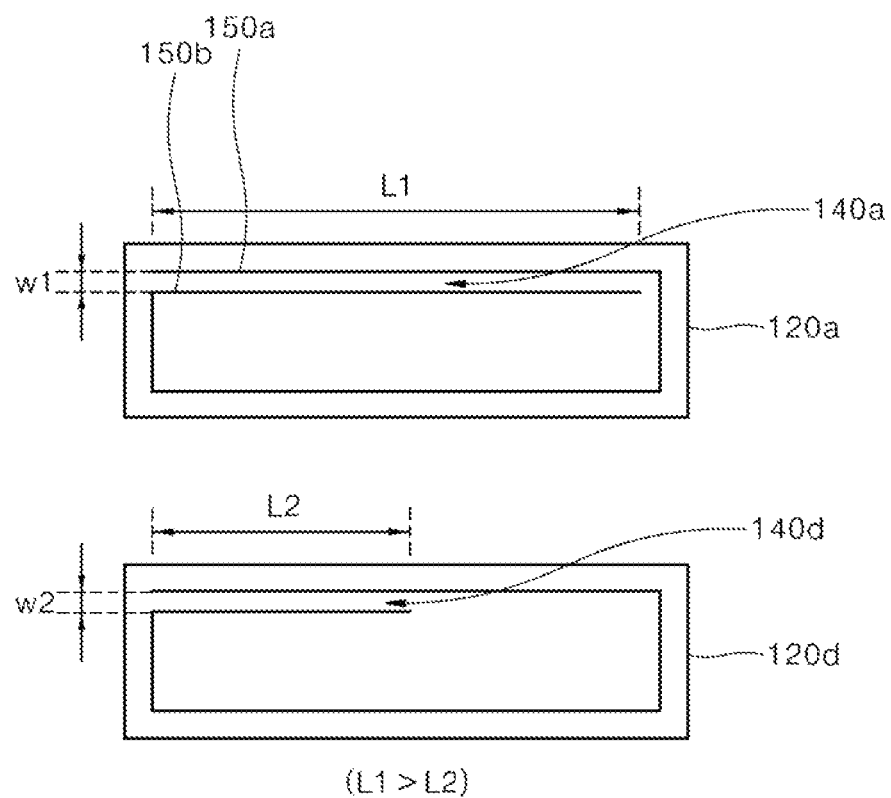
FIG. 4 illustrates lengths and widths of example electric current injection lines of two of the light-emitting portions in FIG. 1 according to an embodiment of the present disclosure.

FIG. 4 illustrates lengths and widths of example electric current injection lines of two of the light-emitting portions in FIG. 1.

Referring to FIG. 4, an electric current injection line 140a of an upper light-emitting portion 120a is longer than an electric current injection line 140d of a lower light-emitting portion 120d. In the situation of an electric current injection line made of ITO, resistance of the electric current injection line can is expressed as follows:

Resistance of electric current injection line=ITO sheet resistance×length of electric current injection line/width of electric current injection line.

According to the above formula, resistance of an electric current injection line is proportional to a length of the electric current injection line and is inversely proportional to a width of the electric current injection line.

Resistance of an electric current injection line 140a of an upper light-emitting portion 120a is expressed as follows:

Resistance of electric current injection line=ITO sheet resistance×L1/w1.

Resistance of an electric current injection line 140d of a lower light-emitting portion 120d is expressed as follows:

Resistance of electric current injection line=ITO sheet resistance×L2/w2.

ITO sheet resistance is determined according to the material. When electric current injection lines have the same width, the longer electric current injection line has higher resistance.

Table 1 shows resistance of electric current injection lines according to lengths of the electric current injection lines. The electric current injection lines are made of ITO.

TABLE 1

| No. | Sheet resistance (Ω) | W (um) | L (um) | Resistance of electric current injection line (Ω) |
| --- | --- | --- | --- | --- |
| 1 | 110 | 5.0 | 440 | 9680 |
| 2 | | | 400 | 8800 |
| 3 | | | 360 | 7920 |
| 4 | | | 320 | 7040 |
| 5 | | | 280 | 6160 |
| 6 | | | 240 | 5280 |
| 7 | | | 200 | 4400 |
| 8 | | | 160 | 3520 |
| 9 | | | 120 | 2640 |

As shown in table 1, the longer the electric current injection line is, the higher resistance the electric current injection line has. The length of the electric current injection line of each light-emitting portion is adjusted to adjust the resistance of the electric current injection line. Thus, when luminance of a light-emitting portion is desired to be increased, the electric current injection line can be shortened, and when luminance of a light-emitting portion is desired to be decreased, the electric current injection line can be lengthened.

Referring to FIGS. 1 and 2, a first insulator line 150a and a second insulator line 150b are arranged on both sides of an electric current injection line 140a, 140b, 140c and 140d. In processing, a first electrode 220 is arranged on the front surface of a substrate, and then lines are formed through etching and filled with insulators to form first and second insulator lines 150a, 150b (e.g., in other words, the first and second insulator lines can define the electric current injection line). For example, the first and second insulator lines can pattern parts of a sheet or layer of conductive material (e.g., ITO) into a spiral shaped wire around each of the light emitting portions or a winding wire shape around or adjacent to each of the light emitting portions.

The first insulator line 150a arranged along the edge of a light-emitting portion is to prevent electric current from being injected into other parts of the first electrode except for an electric current injection line. The first insulator line 150a surrounds the light-emitting portion but has an open structure rather than a closed structure such that electric current is injected into the light-emitting portion. That is, there is a gap between both ends of the first insulator line 150a, and electric current is injected into the light-emitting portion through the gap.

The second insulator line 150b is arranged in parallel with a part of the first insulator line 150a. Specifically, the second insulator line 150b extends from the end of the first insulator line 150a and is arranged in parallel with the first insulator line 150a. A length of an electric current injection line is determined according to a length of the second insulator line 150b. Thus, resistance of the electric current injection line can be determined. In other words, when the second insulator line 150b is made shorter, then the resistance of the corresponding electric current injection line is reduced, and when the second insulator line 150b is made longer, then the resistance of the corresponding electric current injection line is increased (e.g., the second insulator line 150b can acts like a type of dam routing and controlling the flow of electric current into the light emitting area LA, similar to controlling the flow water).

Referring to FIG. 2, an integrally structured gate line 210 is arranged in the non-light-emitting area (NLA) while contacting the first electrode 220. In this situation, a structure where a gate line 210, a first electrode 220 and an insulation layer 230 are stacked can be included in the non-light-emitting area (NLA).

The first electrode 220 in the lower part of the organic light-emitting layer 240 can be made of a transparent conductive oxide such that light emits from the lower part of the substrate 110, e.g., the bottom of the substrate. However, a transparent conductive oxide such as ITO has higher resistance than a metallic material. In this situation, when the gate line 210 is further arranged between the substrate 110 and the first electrode 220, as in FIG. 2, electric current can be evenly supplied to the plurality of light-emitting portions. The gate line 210 can be made of a metallic material having resistance lower than that of a transparent conductive oxide.

However, when electric current concentrates on an area near the gate line 210, uniformity of luminance may decrease. Accordingly, the insulation layer 230 is arranged on the upper part of the first electrode 220 in the non-light-emitting area (NLA) to cover the gate line 210. Also, the insulation layer 230 can be arranged not only in the upper part of the gate line 210 but also in a part that is desired to be insulated from other parts, e.g., insulation between a second pad and the first electrode. Additionally, the insulation layer 230 can be integrally formed with the insulator lines 150a and 150b. That is, the insulator lines 150a and 150b can be a part of the insulation layer 230.

Referring to FIG. 1, a pad portion 160 is arranged on one edge of the substrate 110.

Though not specifically illustrated in FIG. 1, the pad portion 160 includes a first pad and a second pad. The first pad connects with the first electrode while the second pad connects with the second electrode.

In this situation, as in FIG. 1, when an electric current injection line is located farther away from the pad portion 160, a length of the electric current injection line can become shorter.

Also, a routing portion can be arranged on both edges of the pad portion. When an electric current injection line is located closer to the routing portion, a length of the electric current injection line can be made longer. Herein, the routing portion has a width greater than that of the gate line. Even though the routing portion and the gate line are made of the same metallic material and formed as the same layer, electric current can concentrate around the routing portion because the routing portion has resistance lower than that of the gate line, according to the above formula. To solve the problem, as in embodiments of the present disclosure, an electric current injection line of a light-emitting portion near the routing portion is made longer to decrease luminance while an electric current injection line of a light-emitting portion located far away from the routing portion is made shorter to increase luminance.

Figure 5:
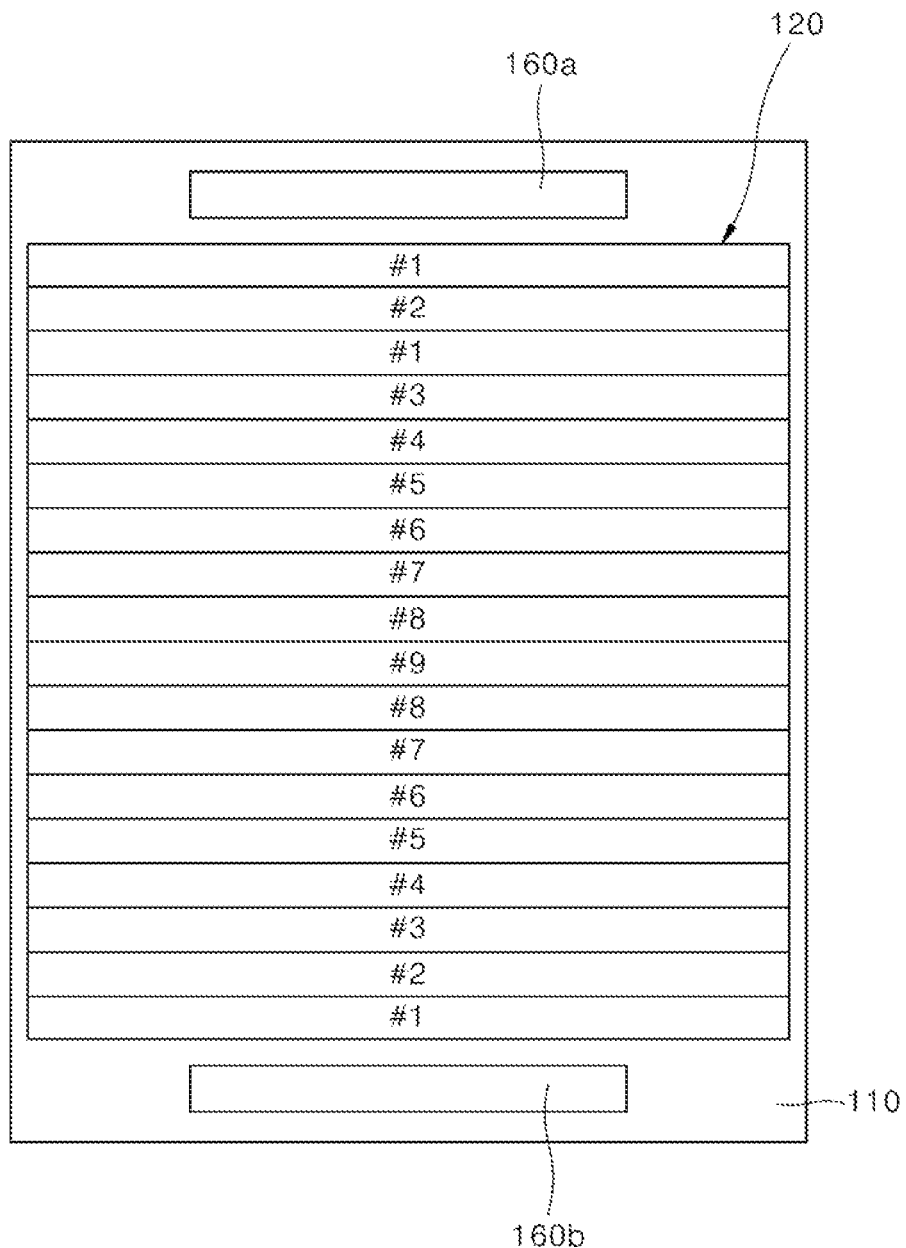
FIG. 5 is a plan view schematically illustrating an example organic lighting apparatus according to an embodiment of the present disclosure.
Figure 6:
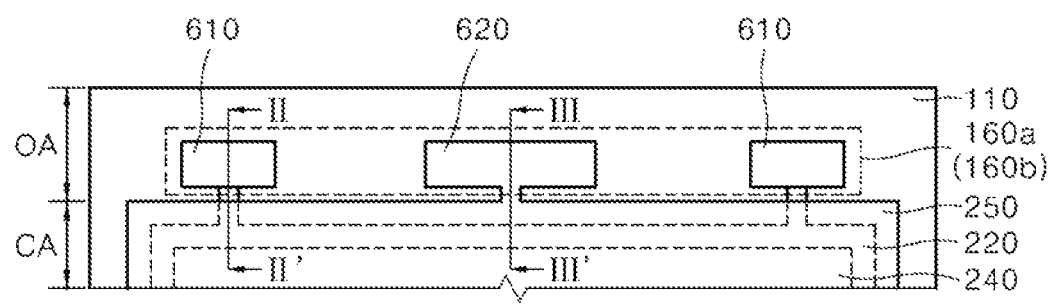
FIG. 6 is a plan view schematically illustrating an example pad portion according to an embodiment of the present disclosure.

FIG. 5 is a plan view schematically illustrating an example organic lighting apparatus, and FIG. 6 is a plan view schematically illustrating an example pad portion used for embodiments of the present disclosure.

FIG. 1 illustrates an example organic lighting apparatus that includes a single pad portion, and FIG. 5 illustrates an example organic lighting apparatus that includes two pad portions.

Referring to FIGS. 5 and 6, a first pad portion 160a is arranged on one side of the outer area (OA) of the substrate 110, and a second pad portion 160b is arranged on the other side of the outer area (OA) of the substrate 110. The first pad portion 160a and second pad portion 160b respectively include a first pad 610 and a second pad 620.

Specifically, referring to FIG. 6, the first pad portion 160a, arranged on one side of the outer area (OA) of the substrate 110, includes a first pad 610 connecting with the first electrode 220, and second pad 620 connecting with the second electrode 250. Additionally, the second pad portion 160b, arranged on the other side of the outer area (OA) of the substrate 110, includes a first pad 610 connecting with the first electrode 220 and a second pad 620 connecting with the second electrode 250. The first pad portion 160a and second pad portion 160b respectively connect with a printed circuit board.

The organic lighting apparatus in FIG. 5 includes 17 light-emitting portions (#1 to #9 to #1). In this situation, when an electric current injection line, arranged on the edge of a light-emitting portion, is farther away from the first pad portion 160a and second pad portion 160b, e.g., further toward a central light-emitting portion (#9), the electric current injection line can be shortened to enhance uniformity of luminance. Accordingly, the seventeen light-emitting portions can be symmetrical to the central light-emitting portion (#9). Additionally, the electric current injection line included in each of the light-emitting portions can be symmetrical to the central light-emitting portion (#9). When routing portions, the one end of which connects with the first pad portion 160a and the other end of which connects with the gate line of each light-emitting portion, are arranged respectively on both edges of each of the first pad portion 160a and second pad portion 160b, the routing portions can be symmetrical to the central light-emitting portion (#9). Conversely, when an electric current injection line, arranged on the edge of a light-emitting portion, is closer to the first pad portion 160a and second pad portion 160b, e.g., further toward a light-emitting portion (#1) closest to the pad portion, the electric current injection line can be lengthened.

Figure 7A:
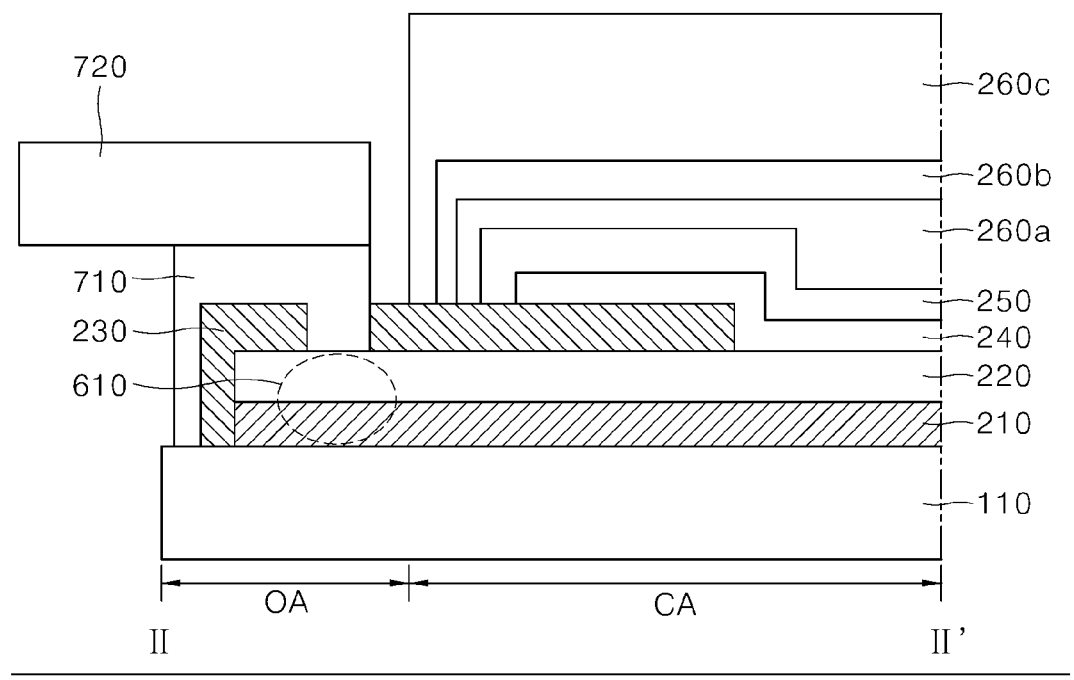
FIG. 7a is a view illustrating a cross section cut along line II-IF in FIG. 6 according to an embodiment of the present disclosure.
Figure 7B:
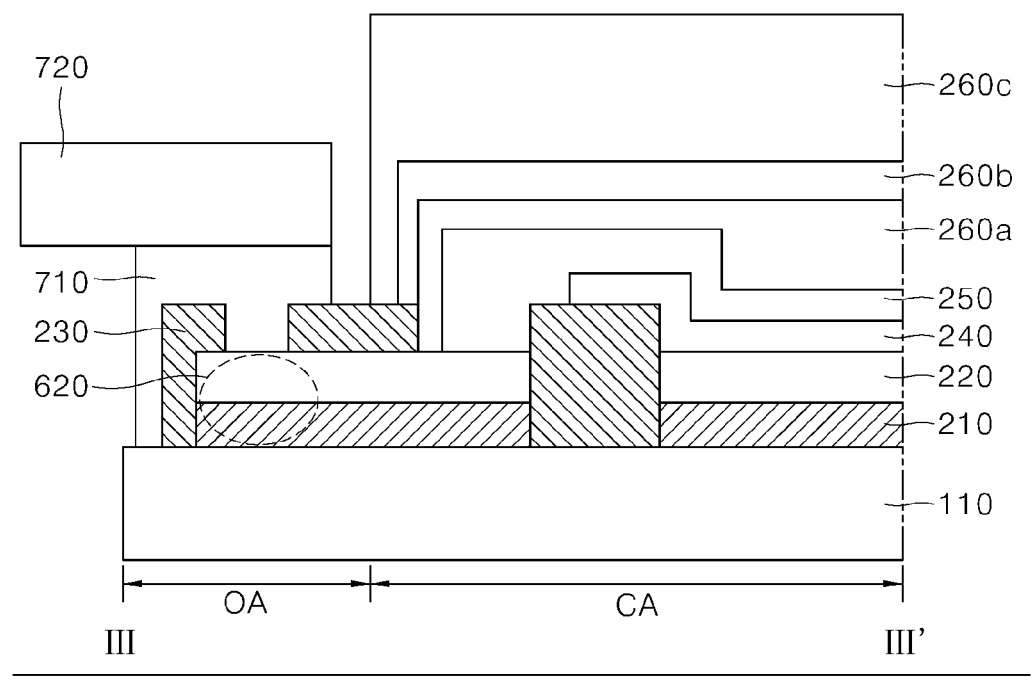
FIG. 7b is a view illustrating a cross section cut along line III-III' in FIG. 6 according to an embodiment of the present disclosure.

FIG. 7a is a view illustrating a cross section cut along line II-II' in FIG. 6, and FIG. 7b is a view illustrating a cross section cut along line in FIG. 6.

FIG. 7a and FIG. 7b schematically illustrate a structure of an example pad portion.

A gate line 210, a first electrode 220, an insulation layer 230, an organic light-emitting layer 240 and a second electrode 250 are consecutively arranged in the central area (CA) of a substrate 110. Additionally, a gate line 210, a first electrode 220 and an insulation layer 230 are consecutively arranged on the outer area (OA) of the substrate 110. Referring to FIG. 7a, a part, exposed upward, of the first electrode 220 can be a first pad 610 in the outer area (OA). Referring to FIG. 7b, a part, exposed upward, of the first electrode 220 can be a second pad 620 in the outer area (OA). That is, the first pad and the second pad can be formed as the same layer as the first electrode, or the gate line and the first electrode. However, the second pad 620 is insulated from the first electrode 220 by the insulation layer 230 and connects with the second electrode 250. The first pad 610 and the second pad 620 can have a multi-layer structure where two or more layers are stacked and, in this situation, the multi-layer structure can include a first layer formed as the same layer as the gate line 210 and a second layer formed as the same layer as the first electrode 220.

The first pad 610 and the second pad 620 connects with a printed circuit board 720. A conductive film or a conductive adhesive 710, such as an anisotropic conductive film (ACF), can be used to connect the first pad 610 and the second pad 620 with a printed circuit board 720.

Referring to FIGS. 7a and 7b, a plurality of layers 260a, 260b and 260c are further formed on the second electrode. At least one of the plurality of layers can be an encapsulation layer. The encapsulation layer can be made of a material for excellently preventing moisture and air from invading, such as an inorganic material or a metallic material. FIGS. 7a and 7b illustrate a structure where an organic or inorganic buffer layer 260a, an inorganic layer 260b and a metallic layer 260c are consecutively stacked. However, the structure of the encapsulation layer is not limited to a three-layer structure. Accordingly, the encapsulation layer can have a single-layer, two-layer or four or more-layer structure. When a metallic film is used as the metallic layer 260c, an adhesive layer can be arranged between the inorganic layer 260b and the metallic layer 260c. Additionally, at least one of the plurality of layers can serve as a planarization layer. FIGS. 7a and 7b illustrate an organic or inorganic buffer layer 260a as a planarization layer.

Figure 8:
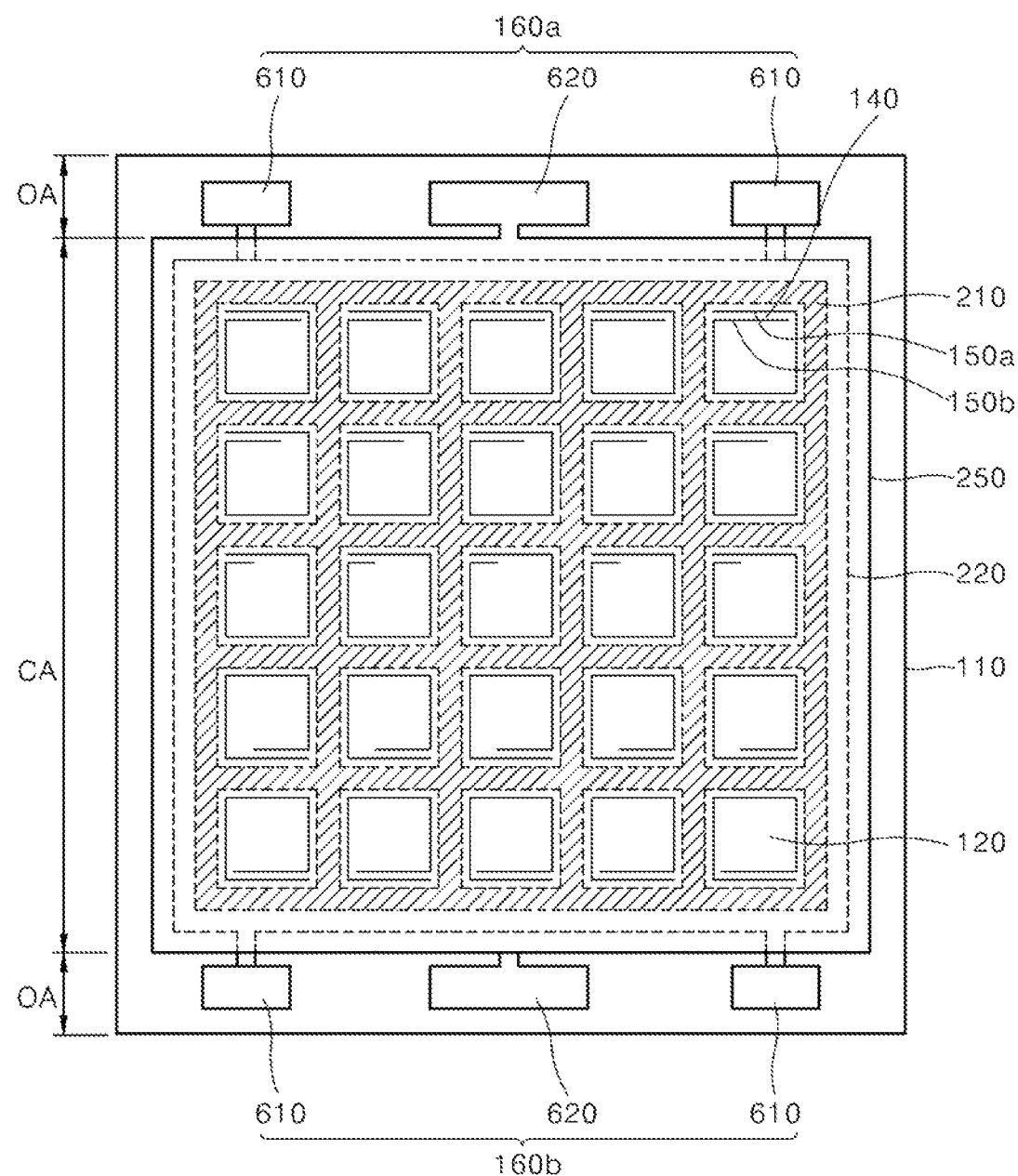
FIG. 8 is a plan view schematically illustrating another example organic lighting apparatus according to an embodiment of the present disclosure.

FIG. 8 is a plan view schematically illustrating another example organic lighting apparatus.

Referring to FIGS. 2 and 8, an example organic lighting apparatus includes a substrate 110, a gate line 210, a first insulator line 150a, a second insulator line 150b, a first electrode 220, an insulation layer 230, an organic light-emitting layer 240 and a second electrode 250.

The gate line 210 is arranged in the central area (CA) of the substrate 110. The gate line 210 has a net shape and, together with the insulation layer 230, defines a plurality of light-emitting portions 120. The gate line 210 can be made of a metallic material and arranged not only in the central area (CA) of the substrate 110 but also in the outer area (OA) of the substrate 110. The gate line, arranged in the outer area (OA) of the substrate 110, constitutes a part of a pad portion, performs routing to distribute electric current to a gate line arranged in the central area (CA) of the substrate 110 or covers up layers in the upper part of the gate line considering light emitted from the lower part of the substrate.

The first insulator line 150a is arranged on the substrate in which the gate line 210 is arranged in parallel with the gate line 210 on the edges of the plurality of light-emitting portions. The second insulator line 150b is arranged in parallel with a part of the first insulator line 150a.

The first electrode 220 is arranged on the substrate in which the gate line 210 is arranged in the remaining areas except for the first insulator line 150a and the second insulator line 150b (e.g., the first electrode 220 can have a plate type shape or be a sheet or layer of conductive material, such as ITO or aluminum, that is patterned with the first and second insulator lines). The first electrode 220 can be made of a transparent conductive oxide.

An electric current injection line 140 is arranged between the first insulator line 150a and the second insulator line 150b. The electric current injection line can be a part of the first electrode 220 (e.g., a channel type area for routing current between the first and second insulator lines). According to an organic lighting apparatus according to embodiments of the present disclosure, lengths of second insulator lines 150b of at least two of the plurality of the light-emitting portions 120 are different from each other. Thus, electric current injection lines 140 of at least two of the plurality of the light-emitting portions 120 have different lengths and different resistances.

The insulation layer (230 in FIG. 2) is arranged on the substrate on which the first electrode 220 is arranged to at least cover up the gate line 210. The first insulator line 150a and the second insulator line 150b can be a part of the insulation layer (e.g., the insulation layer filling lines etched into first electrode having a sheet or plate type shape).

An organic light-emitting layer (240 in FIG. 2) is arranged on the substrate on which the insulation layer 230 is arranged. The organic light-emitting layer, for instance, includes an electron injection layer, an electron transport layer, a light-emitting layer, a hole transport layer, a hole injection layer, and the like. The organic light-emitting layer is arranged between an anode and a cathode. In embodiments of the present disclosure, the first electrode 220 can be an anode while the second electrode 250 can be a cathode, or vice versa.

The second electrode 250 is arranged on the organic light-emitting layer 240 and can be made of a metallic material, such as aluminum. The second electrode 250 made of a metallic material, such as aluminum, can serve as a reflecting electrode. When the second electrode 250 is made of a transparent conductive oxide, light can emit from the upper and lower parts of the substrate.

Additionally, a pad portion 160a and 160b that respectively includes a first pad 610 electrically connecting with the first electrode 220 and a second pad 620 electrically connecting with the second electrode 250 can be arranged on one side and the other side of the outer area (OA) of the substrate. In this situation, when the second insulator line 150b is located farther away from the pad portion, the second insulator line 150b can be made shorter.

According to an organic lighting apparatus of an embodiment of the present disclosure, the electric current injection line of each of the light-emitting portions has a different length to have different resistance. Thus, luminance of the light-emitting portions can be easily adjusted, thereby making it possible to enhance uniformity of luminance of the organic lighting apparatus as a whole.

The implementations of the present invention have been described with reference to the drawings. However, it will be apparent that the invention is not limited to the implementations and drawings set forth herein and may be modified and changed by one having ordinary skill in the art within the technical spirit of the invention. Further, even though effects of configurations of the invention are not explicitly described in the description of the implementations, expected advantages based on the configurations should be included in the scope of the invention.

What is claimed is:
1. An organic lighting apparatus comprising:
 a substrate; and
 a plurality of light-emitting portions disposed in a central area of the substrate,
 wherein each of the plurality of light-emitting portions has a structure including:
  a first electrode,
  an organic light-emitting layer,
  a second electrode,
  a non-light emitting area,
  a light-emitting area, and
  an electric current injection line disposed in the non-light emitting area,
 wherein the electric current injection lines of at least two light-emitting portions, among the plurality of light-emitting portions, have different lengths, and
 wherein the non-light emitting area includes a gate line that is integrally structured and contacts the first electrode, and the non-light-emitting area includes a structure where the gate line, the first electrode and an insulation layer are stacked on each other.
2. The organic lighting apparatus of claim 1, wherein each of the plurality of light-emitting portions further includes a first insulator line and a second insulator line arranged on opposite sides of the electric current injection line.

3. The organic lighting apparatus of claim 1, further comprising:
a pad portion including a first pad connecting with the first electrode and a second pad connecting with the second electrode, the pad portion being arranged at one edge of the substrate,
wherein the at least two light-emitting portions include a first light-emitting portion located farther away from the pad portion than a second light-emitting portion among the at least two light-emitting portions, and
wherein the electric current injection line of the first light-emitting portion is shorter than the electric current injection line of the second light-emitting portion.

4. The organic lighting apparatus of claim 3, wherein a line resistance of the electric current injection line of the first light-emitting portion is less than a line resistance of the electric current injection line of the second light-emitting portion.

5. The organic lighting apparatus of claim 1, further comprising:
a first pad portion including a first pad connecting with the first electrode and a second pad connecting with the second electrode, the first pad portion being arranged at one edge of the substrate; and
a second pad portion including a first pad connecting with the first electrode and a second pad connecting with the second electrode, the second pad portion being arranged at another edge of the substrate,
wherein the at least two light-emitting portions include a first light-emitting portion located farther away from the first or second pad portions than a second light-emitting portion among the at least two light-emitting portions, and
wherein the electric current injection line of the first light-emitting portion is shorter than the electric current injection line of the second light-emitting portion.

6. An organic lighting apparatus comprising:
a substrate;
a gate line disposed in a central area of the substrate, the gate line having a net shape defining a plurality of light-emitting portions;
a first insulator line disposed in each of the plurality of light-emitting portions on the substrate, the first insulator line being parallel with the gate line on edges of the plurality of light-emitting portions;
a second insulator line disposed in each of the plurality of light-emitting portions on the substrate, the second insulator line being parallel with a part of the first insulator line in a corresponding light-emitting portion;
a first electrode disposed across a majority of the substrate except for in regions of the substrate corresponding to the first and second insulator lines;
an insulation layer disposed on the substrate and covering the gate line;
an organic light-emitting layer disposed on the insulating layer;
a second electrode disposed on the organic light-emitting layer; and
a pad portion including a first pad electrically connecting with the first electrode and a second pad electrically connecting with the second electrode, the pad portion being arranged at one side of an outer area of the substrate,
wherein the second insulator lines of at least two of the plurality of light-emitting portions have different lengths,
wherein the at least two light-emitting portions include a first light-emitting portion located farther away from the pad portion than a second light-emitting portion among the at least two light-emitting portions, and
wherein an electric current injection line of the first light-emitting portion is shorter than an electric current injection line of the second light-emitting portion.

7. The organic lighting apparatus of claim 6, wherein each of the plurality of light-emitting portions includes an electric current injection line disposed between the first and second insulator lines of the corresponding light-emitting portion, and the electric current injection line is a part of the first electrode.

8. The organic lighting apparatus of claim 6, wherein the gate line includes a metallic material, and
wherein the first electrode includes a transparent conductive oxide.

9. The organic lighting apparatus of claim 6, wherein a line resistance of the electric current injection line of the first light-emitting portion is less than a line resistance of the electric current injection line of the second light-emitting portion.

10. The organic lighting apparatus of claim 6, wherein each of the first pad and the second pad includes a first layer formed as a same layer as the gate line and a second layer formed as a same layer as the first electrode.

11. An organic lighting apparatus comprising:
a first electrode disposed on a substrate;
an organic layer disposed on the first electrode;
a second electrode disposed on the organic layer;
a first light-emitting portion including:
a first electric current injection line disposed adjacent to a first portion of the organic layer, the first electric current injection line being electrically connected to the first electrode;
a second light-emitting portion including:
a second electric current injection line disposed adjacent to a second portion of the organic layer, the second electric current injection line being electrically connected to the second electrode; and
a first pad electrically connecting with the first electrode,
wherein a first length of the first electric current injection line of the first light-emitting portion is different than a second length of the second light-emitting portion,
wherein the second light-emitting portion is located farther away from the first pad than the first light-emitting portion, and
wherein the second electric current injection line is shorter than the first electric current injection line.

12. The organic lighting apparatus of claim 11, further comprising:
a first insulator line disposed in the first light-emitting portion;
a second insulator line disposed in the first light-emitting portion;
a third insulator line disposed in the second light-emitting portion; and
a fourth insulator line disposed in the second light-emitting portion,
wherein the first electric current injection line is disposed between the first and second insulator lines, and
wherein the second electric current injection line is disposed between the third and fourth insulator lines.

13. The organic lighting apparatus of claim 12, wherein the first and second insulator lines form a first spiral shape, and wherein the second and fourth insulator lines form a second spiral shape.

14. The organic lighting apparatus of claim 12, further comprising:
etched portions disposed in the first electrode,
wherein the first, second, third and fourth insulator lines are disposed in the etched portions of the first electrode.

15. The organic lighting apparatus of claim 12, wherein the first insulator line is disposed along a first perimeter of the first light-emitting portion and connected to the second insulator line, and
wherein the third insulator line is disposed along a second perimeter of the second light-emitting portion and connected to the fourth insulator line.

16. The organic lighting apparatus of claim 11, wherein a line resistance of the second electric current injection line is less than a line resistance of the first electric current injection line.

\* \* \* \* \*